(12) United States Patent
Ando et al.

(10) Patent No.: US 11,864,474 B2
(45) Date of Patent: Jan. 2, 2024

(54) RERAM ANALOG PUF USING FILAMENT LOCATION

(71) Applicant: INTERNATIONAL BUSINESS MACHINES CORPORATION, Armonk, NY (US)

(72) Inventors: Takashi Ando, Eastchester, NY (US); Franco Stellari, Waldwick, NJ (US); Guy M. Cohen, Westchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 17/655,184

(22) Filed: Mar. 17, 2022

(65) Prior Publication Data
US 2023/0301212 A1  Sep. 21, 2023

(51) Int. Cl.
*G11C 11/00* (2006.01)
*H10N 70/20* (2023.01)
*G11C 29/50* (2006.01)
*G11C 13/00* (2006.01)

(52) U.S. Cl.
CPC ......... *H10N 70/257* (2023.02); *G11C 13/004* (2013.01); *G11C 29/50* (2013.01)

(58) Field of Classification Search
CPC ..... G11C 13/004; G11C 29/50; H10N 70/257
USPC ....................................................... 365/148
See application file for complete search history.

(56) References Cited

U.S. PATENT DOCUMENTS

| | | |
|---|---|---|
| 9,570,678 B1 | 2/2017 | Jo |
| 9,985,791 B2 | 5/2018 | Cambou |
| 9,997,244 B1 | 6/2018 | Chih |
| 10,103,895 B1 | 10/2018 | Tseng |
| 10,269,860 B2* | 4/2019 | Ang .................. H01L 27/14683 |
| 10,903,421 B2 | 1/2021 | Kong |
| 10,910,559 B2* | 2/2021 | Defferriere ........... G11C 13/048 |
| 11,145,814 B2 | 10/2021 | Gong |
| 2020/0169423 A1 | 5/2020 | Cambou |
| 2021/0342489 A1 | 11/2021 | Kumar |

FOREIGN PATENT DOCUMENTS

CN          107195777 B       4/2019

OTHER PUBLICATIONS

Alexandros Emboras et al., "Nanoscale plasmonic memristor with optical readout functionality." Nano Letters, vol. 13, No. 12, 2013, pp. 6151-6155.
An Chen, "Utilizing the variability of resistive random access memory to implement reconfigurable physical unclonable functions," IEEE Electron Device Letters, vol. 36, No. 2, 2014, pp. 138-140.
Gyo Sub Lee et al., "Enhanced reconfigurable physical unclonable function based on stochastic nature of multilevel cell RRAM," IEEE Transactions on Electron Devices, vol. 66, No. 4, 2019, pp. 1717-1721.
Stellari et al., "RRAM Filament Location Based On NIR Emission," U.S. Appl. No. 17/072,810, filed Oct. 16, 2020, 40 pages.

* cited by examiner

*Primary Examiner* — Vu A Le
(74) *Attorney, Agent, or Firm* — Jeffrey M. Ingalls

(57) ABSTRACT

A semiconductor device is provided. The semiconductor device includes a resistive memory device, and at least a first photodetector and a second photodetector positioned adjacent to the resistive memory device to allow for measurement of the intensity of photon emission from a filament of the resistive memory device.

20 Claims, 4 Drawing Sheets

RERAM ANALOG PUF USING FILAMENT LOCATION

BACKGROUND

The present disclosure relates in general to systems and methods that can locate a conductive filament being formed in resistive random access memory (ReRAM) devices.

A resistive random access memory (ReRAM or RRAM) device includes a switching medium situated between two electrodes. Conductive filaments can be formed between the two electrodes to provide a conducting path between the electrodes. The filaments can be formed by applying an appropriate amount of voltage to the ReRAM device.

ReRAM structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a cross-bar array of ReRAMs, which may enable a fully-connected neural network.

SUMMARY

Embodiments of the present disclosure relate to a semiconductor device. The semiconductor device includes a resistive memory device; and at least a first photodetector and a second photodetector positioned adjacent to the resistive memory device to allow for measurement of the intensity of photon emission from a filament of the resistive memory device.

Other embodiments relate to a method that includes acquiring signals from at least a first photodetector and a second photodetector indicating intensities of photon emission from a filament of a resistive memory device; and determining a location of a filament in a switching medium of the resistive memory device comparing the intensities of the acquired signals.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figures 1, 2:
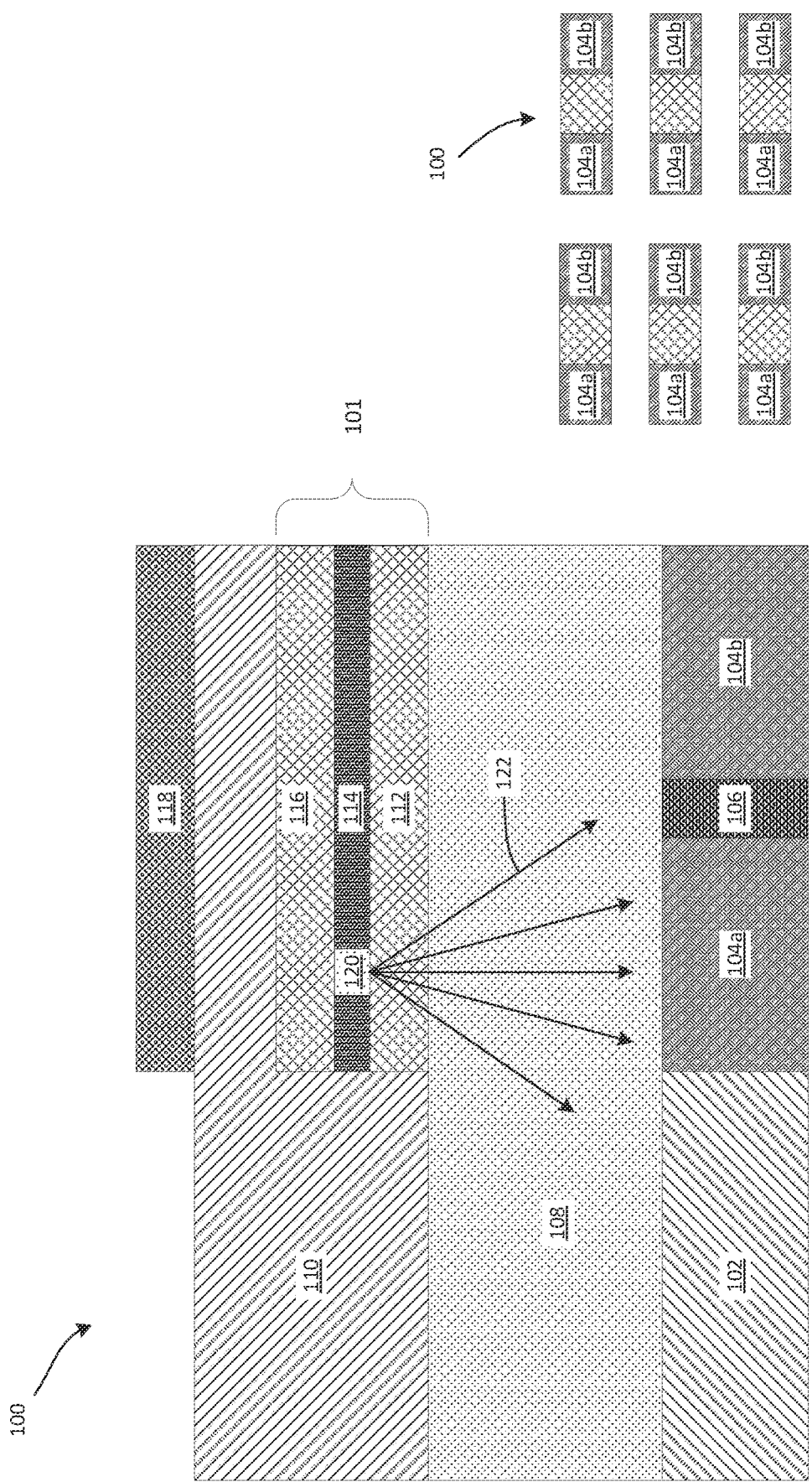
FIG. 1 is a cross-sectional view of a semiconductor device that includes an ReRAM device including photodetectors, at an intermediate stage of the manufacturing process, according to embodiments.
FIG. 2 is a top-down view of the semiconductor device of FIG. 1, according to embodiments.

A resistive random access memory (ReRAM) device can be switched among multiple states, where the states can be characterized by the ReRAM device's resistance. In an example, to program the ReRAM device, a voltage can be applied to the ReRAM device to cause a conductive filament to form in the switching medium or insulating layer. The formation of the filament can cause the ReRAM device to switch from a relatively high resistive state (e.g., when the conductive filament is absent), to a relatively low resistive state. In some examples, an erase process can be implemented to reverse the ReRAM back to the relatively high resistive state. The changes to the resistive states of the ReRAM device can be associated with respective states of a binary bit. Accordingly, ReRAM devices can be implemented as memory cells and can be programmed or erased to represent binary states zero or one.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure of a resistive memory device (e.g., a ReRAM device) that can be used as classic memory applications. A resistive random access memory (ReRAM) device can be switched among multiple states, where the states can be characterized by the ReRAM device's resistance. In an example, to program the ReRAM device, a voltage can be applied to the ReRAM device to cause a conductive filament to form in the switching medium or insulating layer. The formation of the filament can cause the ReRAM device to switch from a relatively high resistive state (e.g., when the conductive filament is absent), to a relatively low resistive state. In some examples, an erase process can be implemented to reverse the ReRAM back to the relatively high resistive state. The changes to the resistive states of the ReRAM device can be associated with respective states of a binary bit. Accordingly, ReRAM devices can be implemented as memory cells and can be programmed or erased to represent binary states zero or one.

The ReRAM device can also be used in neuromorphic computing applications in which each resistive memory device (e.g., a ReRAM device) can be used as a connection (synapse) between a pre-neuron and post-neuron, representing the connection weight in the form of device resistance. Multiple pre-neurons and post-neurons can be connected through a crossbar array of ReRAMs, which naturally expresses a fully-connected neural network. A crossbar array of ReRAM can be made with junction with resistively switching material formed on the bottom electrodes. The top electrodes are formed on the junction with resistively switching material to form a crossbar array of ReRAMs.

Non-volatile resistively switching metal oxides, such as $HfO_x$, $TaO_x$, $AlO_x$, $ZrO_x$, $TiO_x$, or a combination of these materials are integrated into nano-crossbar arrays and nano-cross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as $HfO_x$ are integrated as two terminal memory devices to efficiently create a ReRAM bit pattern. These cells can be integrated into crossbar arrays. The switching material can cover the whole chip area and every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons and input signals.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires. The Resistive Processing Unit (RPU) can further enhance the functionality of neuromorphic computing. The new class of devices (RPU) that can be used as processing units to accelerate various algorithms including neural network training.

In recent years, physically unclonable functions (PUFs) have emerged, in which identities are embodied in structures, rather than stored in memory elements. PUFs provide "digital fingerprints," where information is usually read from the static entropy of a system, rather than having an identity artificially programmed into it, preventing a malicious party from making a copy for nefarious use later on. In general, a PUF, is a physical object that for a given input and conditions (challenge), provides a physically defined "digital fingerprint" output (response) that serves as a unique identifier, most often for a semiconductor device such as a microprocessor. PUFs are most often based on unique physical variations which occur naturally during semiconductor manufacturing. A PUF is a physical entity embodied in a physical structure. Today, PUFs are sometimes implemented in integrated circuits and are typically used in applications with high security requirements, more specifically cryptography. In the present embodiments, the random position (or location) of the formation of a conductive filament within a plurality of different ReRAM devices can function as a PUF. That is, for each ReRAM device, the conductive filament will form in different locations for each different device, and this is unique to each set of ReRAMs contained in a given semiconductor device. In certain cases, there is a Poisson uniform distribution of the filaments. This may be a distribution that is ideal for the PUF. Because the locations of the filament are stable after the initial formation, and because these locations are random, they can serve as the "digital fingerprint" for a given semiconductor device.

Referring now to the drawings in which like numerals represent the same or similar elements and initially to FIG. 1, an exemplary semiconductor device 100 (i.e., an ReRAM device or system) to which the present embodiments may be applied is shown. As shown in FIG. 1, at least a first photodetector 104a and a second photodetector 104b are formed under the footprint of (i.e., generally beneath or aligned with) a ReRAM device 101. The first photodetector 104a and second photodetector 104b may, for example, be separated from each other by a spacer layer 106. It should be appreciated that any suitable type of photodetector may be used, and it may be configured, for example to detect photon emission 122 (from the conductive filament 120 of the ReRAM device 101) of various ranges, such as near-infrared (NIR), mid-infrared, infrared, visible, and/or other ranges. In certain embodiments, two photodetectors are used as shown in FIG. 1. However, it should be appreciated that in other examples three or more photodetectors may be used. It should be understood that the location of conductive filament 120 formation may be random and could occur anywhere in the switching layer 114 (discussed below). In the example shown in FIG. 1 the location of the conductive filament 120 is on the left hand side roughly corresponding to the first photodetector 104a. Thus, the photon emission 122 from the conductive filament 120 spreads out in a generally radial configuration as shown by the arrows in FIG. 1. It should be noted that photon emission 122 is typically not directional, but for clarity only the emission directed towards the photodetectors is shown. Due to the relative proximity of the conductive filament 120 to the first photodetector 104a, the first photodetector 104a will measure a larger amount of the photon emission 122 (even though the second photodetector 104b may also receive some amount as well). Thus, the location of the filament 120 can be determined based on these different measurements from the photodetectors.

In certain embodiments, an optional photodetector calibration step may be used where, for example, a signal intensity (noise) is acquired from both photodetectors while there is no signal from the ReRAM device (i.e., no bias applied to the cell). This may be used to reduce or remove differences in sensitivity between the two (or more) photodetectors that may be due, for example, to fabrication process variability. In one embodiment, the noise n1 and n2 of the two photodetectors (ReRAM off) may be subtracted from the signal s1 and s2 (ReRAM on) to better compare the resulting s1' and s2' signals and determine the location of the filament.

In certain embodiments, ReRAM (or conductive bridging RAM (CBRAM)) filaments are formed by electro-forming process, resulting in filament locations in a random distribution. Sensing with the photodetectors is performed while applying an electrical bias to the ReRAM/CBRAM devices. The emission from the current through the filaments can be detected by the photodetectors. The analog location of the filament can be detected by comparing the intensity of at least two photo diodes. To gather only binary information, the system can choose the detector with brighter emission. To gather proportional information, the system may use the ratio (or difference) of the signal between the detectors in either digital or analog fashion. In other examples, more advanced triangulation techniques (e.g., where three or more photodetectors are used) may be used where the signals are inputted into a triangulation model to determine the coordinates of the filament. It should be appreciated that any suitable method of triangulation or interpolation may be used to estimate the position of the filament based on the two or more photodetector measurements. In most cases the structure geometry, including the size of the cell, photodetector area, distances in between, may be considered in the triangulation assuming for example a uniform spherical isotropic emission from the filament.

As shown in FIG. 1 a layer including the first photodetector 104a and the second photodetector 104b may also include a peripheral circuit region 102. In certain examples, the photodetectors can be a photodiode or a CCD (charged-couple device), or even a microbolometer. The peripheral circuit region 102 may include any number of different devices, layers, wirings, transistors etc. In certain embodiments, this layer is manufactured separately from the ReRAM devices and then it is bonded or adhered to the ReRAM substrate. In other embodiments all of the layers in FIG. 1 are manufactured as a single integrated product.

As shown in FIG. 1, in certain examples, several back end of line ("BEOL") layers and front end of line (FEOL) layers 108 may be formed. In general, the front-end-of-line (FEOL) is the first portion of IC fabrication where the individual devices (transistors, capacitors, resistors, etc.) are patterned in the semiconductor. FEOL generally covers everything up to (but not including) the deposition of metal interconnect layers. In general, the BEOL is the second portion of IC fabrication where the individual devices (transistors, capacitors, resistors, etc.) are interconnected with wiring on the wafer. The BEOL metal layers (not shown) can include, for example, Cu, TaN, Ta, Ti, TiN or a combination thereof. A BEOL dielectric layer (not shown) may be formed on the sides of one or more of the BEOL metal layers. The BEOL dielectric layer may be composed of, for example, $SiO_x$, $SiN_x$, SiBCN, low-κ, NBLOK, or any other suitable dielectric material. The structure including the FEOL/BEOL layers 108 may be a starting structure upon which the ReRAM devices are formed.

As also shown in FIG. 1, an ReRAM stack (or ReRAM device 101) is formed on the upper surface of the FEOL/BEOL layers 108. The ReRAM device 101 may include multiple layers such as, for example, multiple electrode layers (a first electrode 112 and a second electrode 116) separated by a switching layer 114. The first electrode 112 and second electrode 116 may include one or more of Nb, NbN, W, WN, Ta, TaN, Ti, TiN, Ru, Jr, Mo, Cr, V, Pd, Pt, Rh, Sc, Al and other high melting point metals or conductive metal nitrides, etc. It should be appreciated that the choice of electrode material and thickness is chosen such that it is semi-transparent to the photons of the wavelength that photodetectors detect. Although not shown in FIG. 1, a lithographic mask may be formed to pattern the ReRAM stack. In this example, the lithographic mask is a tri-layer mask including an organic planarizing layer, a lithographic hardmask (e.g., SiARC, SiN, SiON, etc.), and a photoresist. It should be appreciated that the lithographic hardmask may include a plurality of layers. The photoresist may be formed by patterning using any suitable lithographic and material removal processes known to one of skill in the art.

The switching layer 114 can be a layer of dielectric or insulating materials, such as layered amorphous silicon (a-Si), metal oxides, silicon oxides, Hafnium oxide ($HfO_x$), and/or other types of dielectric materials. It shall be apparent to a person of ordinary skill in the art that other materials can be used for forming the electrodes 112 and 116, and/or the switching layer 114.

In an example, particular amount of voltage and/or current can be applied to the ReRAM device 101 to form the conductive filament 120 in the switching medium 114. The formation of the filament 120 can cause the switching medium 120 be conductive through a conductive path, such as the filament 120. Further, the formation of the filament 120 can cause the ReRAM device 101 to operate in a low resistance state. The filament 120 can be formed based on different mechanisms, such as vacancy or metal defect migration, and/or other mechanisms. In an example, the ReRAM device 101 can be reset by breaking the filament 120, where breaking the filament 120, or the absence of the filament 120, can switch the ReRAM device 101 to operate in a high resistance state.

In an example, photon emission 122 can be detected with one or more of the photodetectors (i.e., first photodetector 104a and second photodetector 104b) of the semiconductor device 100 in response to the formation of the filament 120. The photon emission 122 can be photon emission of various ranges, such as near-infrared (NIR), mid-infrared, infrared, visible, and/or other ranges. The carriers moving from one electrode to the opposite one (e.g., from the first electrode 112 to the second electrode 116, or from the second electrode 116 to the first electrode 114) along the formed or partially-formed filament 120 in the dielectric medium (e.g., switching layer 114) can produce a spontaneous photon emission under certain conditions of device operations, which include voltage across the device and current flowing in the device. The intensity and spectrum of the emission may depend on the bias conditions, for example, higher currents and higher voltages can produce higher emission intensity. In some case, the emission intensity can increase linearly with the current in the cell and exponentially with the applied voltage. The spontaneous photon emission can pass though one of the electrodes (e.g., first electrode 112 for bottom side measurements) and through any BEOL layers (e.g., BEOL/FEOL layer 108) and be measured with the photodetectors 104a and 104b. ReRAM layer 110 generally refers to the layer that includes the ReRAM device 100.

As also shown in FIG. 1, in certain embodiments, a shield layer 118 may optionally be formed over the ReRAM device 101 (also over the ReRAM layer 110) to prevent imaging the filament 120 with an outside image capture device (e.g., a microscope equipped with a camera). In certain examples, the shield layer 118 is made of an opaque material and is sized and positioned to cover the entire switching layer 114 (e.g., encompassing at least the entire area where the filament 120 could form).

Referring now to FIG. 2, this figure is a top-down view of an example semiconductor device 100 that includes a plurality of ReRAM devices 101, where each of the ReRAM devices 101 include a first photodetector 104a and a second photodetector 104b. In other words, there is a 1×2 array of photodetectors for each ReRAM device 101. Two photodetectors per ReRAM device are shown in FIG. 2, however it should be appreciated that three or more photodetectors may be used per ReRAM device, and they may be arranged in different configurations (e.g., a 1×3 array, a 2×2 array, a device including three total photodetectors having a first row including one photodetector and a second row including two photodetectors, etc.).

Figure 3:
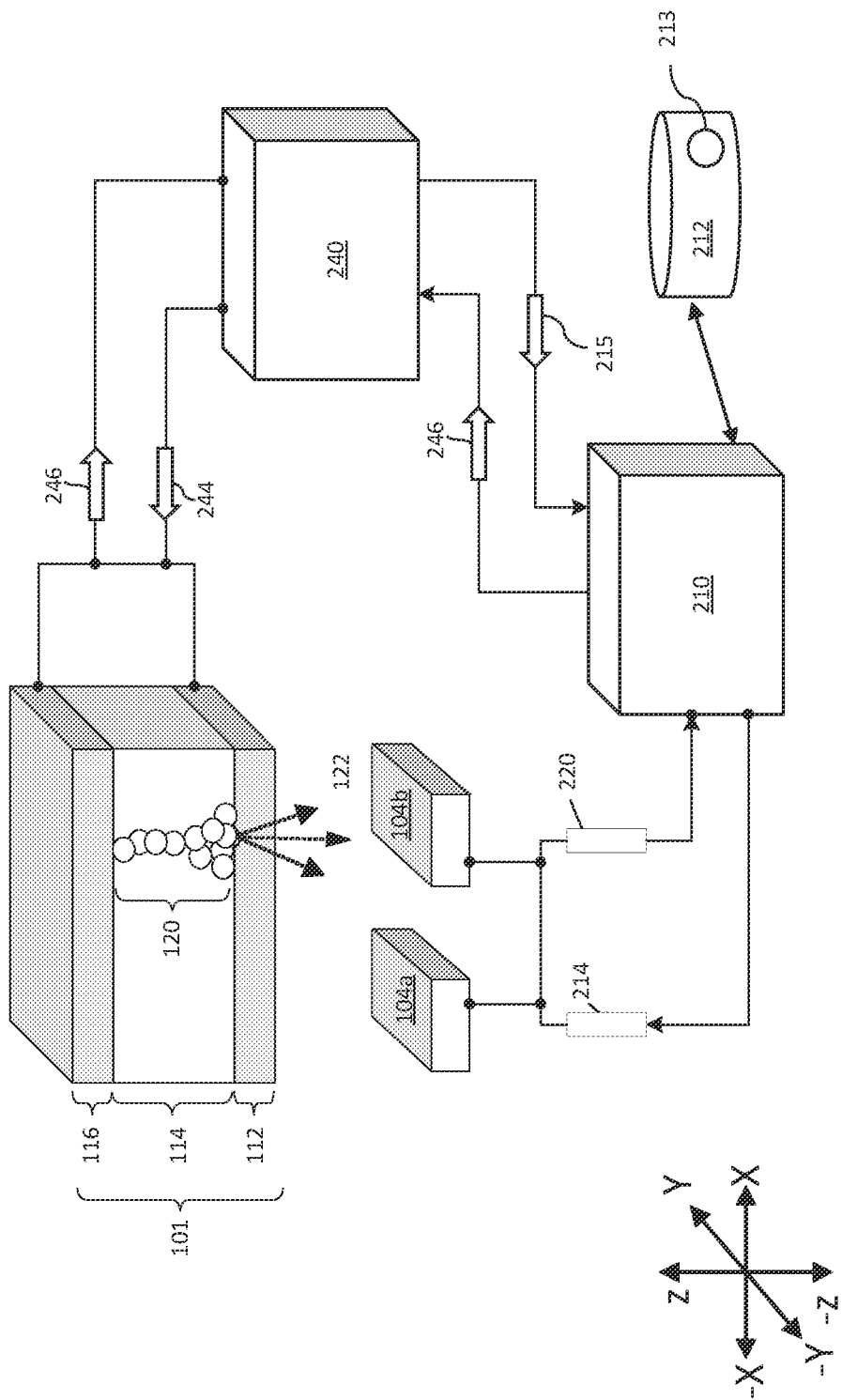
FIG. 3 is a diagram showing an example system that can implement ReRAM filament location based on NIR emission in one embodiment.

FIG. 3 is a diagram showing an example system 200 that can implement ReRAM filament location based on photon emission in certain embodiments. The system 200 can be implemented as an apparatus that can be utilized to form a filament in a switching medium of a ReRAM device 101 and to determine a location in the switching medium where the filament is formed. It should be noted that the ReRAM device 101 of FIG. 3 includes the same reference numerals as that of FIG. 1, and description of the same components is not repeated here for the sake of simplicity. The ReRAM device 101 can be a resistive random access memory (ReRAM) device. The system 200 can include a first device 210, a memory 212, first photodetector 104a and second photodetector 104b, and a second device 240. The first device 210 can be a processor or a controller of the apparatus implementing the system 200. The first photodetector 104a and the second photodetector 104b may be any suitable type of photodetector as described above. The second device 240 can be a meter or a source device, such as a bias supply device, configured to generate and output bias voltage and/or bias current, and to measure attributes such as resistance of source, such as a voltage source or a current source, of the ReRAM device 101. The first device 210 can be configured to be in communication with the memory 212, the first and second photodetectors 104a and 104b, and the second device 240. In some examples, the memory 212 can be a component of the first device 210, such as being a memory device installed or embedded in the first device 210. In some examples, the first device 210 and the memory 212 can be components of a same computing device. The memory 212 can be configured to store a set of instructions 213. The first device 210 can be configured to control operations of the first and second photodetectors 104a-b and the second device 240.

In an example, the second device 240 can apply a particular amount of voltage and/or current to the ReRAM device 101 to form a conductive filament 120 in the switching medium 114. The formation of the filament 120 can cause the switching medium 114 to be conductive through a conductive path, such as the filament 120. Further, the formation of the filament 120 can cause the ReRAM device 101 to operate in a low resistance state. The filament 120 can be formed based on different mechanisms, such as vacancy or metal defect migration, and/or other mechanisms that can be triggered by the particular amount of voltage or current being applied to the resistive memory device. In an example, the ReRAM device 101 can be reset by breaking the filament 120, where breaking the filament 120, or the absence of the filament 120, can switch the ReRAM device 101 to operate in a high resistance state.

Further, the second device 240 can be configured to apply a reverse bias (voltage or current) to the ReRAM device 101. In an example, a ReRAM cell (e.g., resistive memory device) may require a forming step before it can be used as a switching memory device and before photon emission can be detected. Photon emission can be measured during or after the forming process as discussed in previous examples to study the process and the location of the filament. After forming, the ReRAM device can be switched, such as being toggled between a low resistive state (set state) and high resistive state (reset) by applying an appropriate reverse or forward bias voltage or current. The two states (set or reset) have different resistivity but both states are much less resistive than an unformed device. Further, photon emission can also be acquired after forming by biasing the devices in forwards and reverse bias corresponding to set/reset states. This emission can be at the same spatial location (but not always) and can possibly have different characteristics such as different exponential dependencies (models) and/or emission spectra. Therefore, photon emission can be detected and acquired at specific bias points after some triggering event such as the forming jump, or the resistance change caused by reset/set switching.

In an example where the logic content (or state) of the ReRAM memory cell needs to be kept secret or unknown. The detection of photon emission occurring on the ReRAM device can provide indications of whether the ReRAM device was previously formed or not. For example, an unformed ReRAM cell may not emit photon emission under a "non-forming" voltage bias condition. Thus, if photon emission is detected from the ReRAM memory device in response to the application of the reverse bias, then the ReRAM memory device can be deemed as previously formed and its content or state might have been exposed. Further, photon emission intensity and/or spectrum may be a function of current state of the ReRAM cell (e.g., set or reset) after forming. Therefore, one could use detected photon emission to determine the logic state of the ReRAM cell and read the information out.

In the example shown in FIG. 3, the second device 240 can apply a bias 244 to the ReRAM device 101, where the bias 244 can be one or more of a bias voltage and bias current. The second device 240 can be configured to measure a resistance 246 of the ReRAM device 101. The second device 240 can send the measured resistance 246 to the first device 210. The first device 210 can be configured to compare the resistance 246 with a resistance threshold that may be defined in the set of instructions 213. For example, if a resistance threshold RT is defined in the set of instructions 213, then the resistance 246 being less than RT can indicate that the ReRAM device 101 is operating in low resistance state, which means that the filament 120 may have been formed. In response to the resistance 246 being lower than RT, the first device 210 can send the control signal 214 to control the first photodetector 104a and the second photodetector 104b to measure the emission 122 from the filament 120. In another example, the resistance 246 being greater than RT can indicate that the ReRAM device 101 is operating in high resistance state, which means that the filament 120 has yet to be formed. In response to the resistance 246 being greater than RT, the first device 210 can send a control signal 215 to control the second device 240 to increase the amount of bias 244 being applied to the ReRAM device 101.

In an example, photon emission 122 (e.g., photon emission in NIR range) can be detected with one or more of the of the photodetectors (e.g., first photodetector 104a and second photodetector 104b) of the ReRAM device 101 in response to the formation of the filament 120. The photon emission 122 can be photon emission of various ranges, such as near-infrared (NIR), mid-infrared, infrared, visible, and/or other ranges. The carriers moving from one electrode to the opposite one (e.g., from first electrode 112 to second electrode 116, or from second electrode 116 to first electrode 112) along the formed or partially-formed filament 120 in the dielectric medium (e.g., switching layer 114) can produce a spontaneous photon emission under certain conditions of device operations, which include voltage across the device and current flowing in the device. The intensity and spectrum of the emission may depend on the bias conditions, for example, higher currents and higher voltages can produce higher emission intensity. In some case, the emission intensity can increase linearly with the current in the cell and exponentially with the applied voltage. The spontaneous photon emission can pass through the first electrode 112 and be measured with first and second photodetectors 104a-b.

Based on the location of the formation of the filament 120, the first and second photodetectors 104a-b will measure different photon emission intensities (assuming the filament 120 is not directly in the middle of the two photodetectors). The measured intensities of the photodetectors can allow one to localize the active area of the ReRAM device and determine the position of any spontaneous photon emission spot relative to the device geometry, such as the cell center or perimeter. A relatively "bright" photon emission reading on the second photodetector 104b (e.g., as shown in FIG. 3) may indicate that the filament is closer to the second photodetector 104b and the location of the filament 120 on the surface of the ReRAM device 101 can be calculated by the measured values of one or more of the photodetectors 104a-b. The first device 210 can receive the data 220 that includes the data from the photodetectors 104a-b, and can execute the set of instructions 213 stored in the memory 212 to determine a location where the filament 120 is formed in the switching layer 114. For example, the first device 210 can determine that the filament 120 is located to the right side of the ReRAM device 101 nearer to the second photodetector 104b. In some examples, the set of instructions 213 can include interpolation algorithms. The processor 210 can be configured to execute one or more of the interpolation or triangulation algorithms among the set of instructions 213 to determine the location of the filament 120. In some examples, the first device 210 can display a result indicating the determined location of the filament, where the result can include text and/or images. The first device 210 can further store the determined location of the filament in the memory 212.

In an example, the system 200 can also be implemented to monitor filament location over time. For example, the second device 240 can apply a constant voltage or a ramp voltage on a plurality of ReRAM devices. The controller 210 can repeatedly measure the emission from the ReRAM devices over time, and based on the repeated measurements, the controller can plot the formation location of the filament on the different ReRAM devices over time. In an example, a constant or varying (e.g., ramp or saw tooth, staircase, pulsed) bias can be applied to the ReRAM cell over time. The bias could be a voltage or current. During such process, photon emission can occur with a fixed or variable acquisition frame rate. This can be achieved by starting a movie acquisition before the bias is started or by synchronizing individual time-integrated photon emission measurements at predetermined time intervals or specific events, such voltage steps. At each emission frame the filament photon emission spatial location and intensity can be determined as discussed. The location and intensity of the filament photon emission can then be plotted and/or analyzed in correlation to the specific bias conditions applied over time. For example, a pulsed voltage can be applied to the ReRAM cell with a relatively slowly increasing amplitude. Each step duration can be pre-determined to achieve specific goals. The corresponding current in the cell can be electrically measured. A photon emission movie with a fixed framerate can begin before the pulsed voltage ramp. Each movie frame can be analyzed during or after the process to determine the location of the filament at all or specific times. The intensity of the filament photon emission overtime can show that the emission intensity changes in intensity during the process of applying the pulsed voltage over time.

The first device 210 can be configured to acquire the emission measurement of the first and second photodetectors 104a-b. The controller can be further configured to determine the location of the filament 120 in the switching layer 114 of the ReRAM device 101 using the acquired emission measurement. The second device 240 can be configured to apply an amount of bias 244 (e.g., bias voltage and/or bias current) to the ReRAM device 101. The second device 240 can be further configured to measure a resistance 246 of the ReRAM device 101. The second device 240 can be further configured to send the measured resistance 246 to the first device 210. The first device 210 can receive the measured resistance 246 from the second device 240. The first device 210 can determine a resistive state of the ReRAM device 101 based on the measured resistance 246. In an example, in response to the resistive state indicating that the filament 120 is formed in the switching layer 114 of the ReRAM device 101, the first device 210 can control the first and second photodetectors 104a-b to measure the emission 122 intensity of the filament 120. In another example, in response to the resistive state indicating that the filament 120 is not formed in the switching layer 114 of the ReRAM device 101, the first device 210 can control the second device 240 to increase the amount of bias 244 being applied to the ReRAM device 101 to form the filament 120 or to set or to reset the ReRAM device 101, or to read the state of the ReRAM device 101, or to stress the ReRAM device 101 at an elevated voltage over time.

Figure 4:
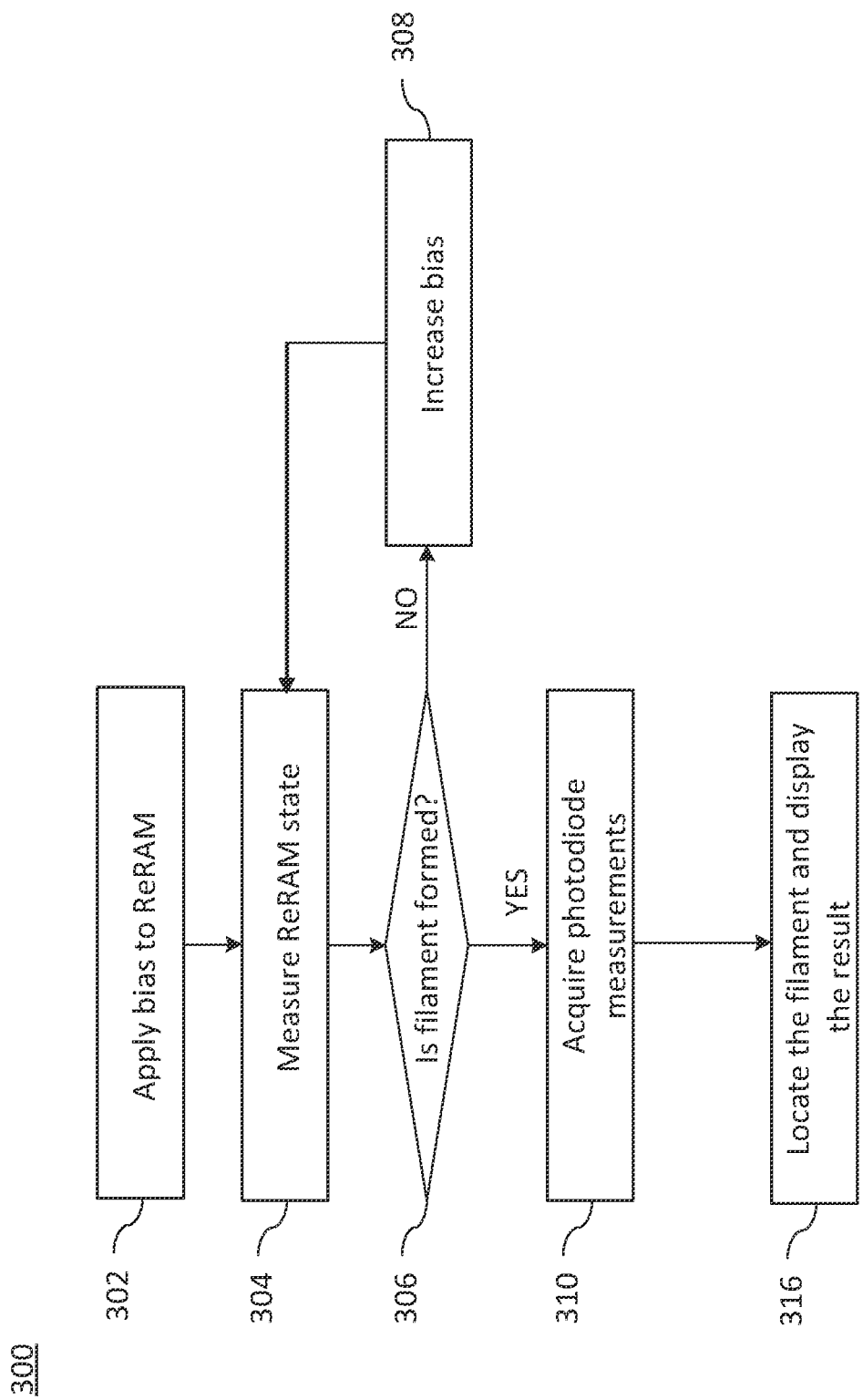
FIG. 4 is a flow diagram illustrating a process of implementing ReRAM filament location based on emission, according to embodiments.

FIG. 4 is a flow diagram illustrating a process 300 to implement ReRAM filament location based on NIR emission in one embodiment. The process 300 can include one or more operations, actions, or functions as illustrated by one or more of operations 302, 304, 306, 308, 310, and/or 316. Although illustrated as discrete blocks, various blocks can be divided into additional blocks, combined into fewer blocks, eliminated, or performed in parallel, depending on the desired implementation.

The process 300 can begin at block 302. At operation 302, a bias supply device (e.g., second device 240 shown in FIG. 3) can apply an amount of bias voltage and/or bias current to a resistive random access memory (ReRAM) device (e.g., ReRAM device 101 shown in FIG. 1 and FIG. 2, respectively). The process 300 can continue from operation 302 to operation 304. At block 304, the bias supply device and a controller (e.g., first device 210 shown in FIG. 3, respectively) can facilitate a measurement of a ReRAM state of the ReRAM device 101. For example, the bias supply device can measure a resistance of the ReRAM device 101, and the controller can determine whether the measured resistance corresponds to a low resistive state or a high resistive state of the ReRAM device 101.

The process 300 can continue from operation 304 to operation 306. At operation 306, the controller can determine whether a conductive filament is formed in a switching medium of the ReRAM device 101. For example, the controller can compare the measured resistance with a defined threshold. If the measured resistance is greater than the defined threshold, then the controller can determine that the Re RAM device 101 is in the high resistive state and no filament was formed, and the process 300 can proceed to operation 308. If the measured resistance is less than the defined threshold, then the controller can determine that the ReRAM device 101 is in the low resistive state and the filament was formed, and the process 300 can proceed to operation 310.

At operation 308, the controller can send a control signal to the bias supply device to increase the amount of bias voltage or bias current being applied to the ReRAM device 101. The increased amount of bias voltage or bias current can be predefined as relatively small increment values, and can be based on a desired implementation of a system or an apparatus performing the process 300. Upon applying the increased amount of bias to the Re RAM device 101, the process 300 can return to operation 304 where the bias supply device can re-measure the resistance of the ReRAM device 101. The controller can determine whether the filament 120 is formed based on the updated measured resistance. The operation 304, 306, 308 can be performed repeatedly until the controller determines that the filament is formed in the switching medium of the ReRAM device 101. In certain embodiments, the photodetector readout can be triggered or synced with the filament forming process. Synching the filament formation with the photodetector readout may help to reduce noise because photodetectors typically have a dark current, so it may be helpful or needed to compare the output of the detectors when the event of filament forming occurs.

At operation 310, the controller can send a control signal to the photodetectors (e.g., the first and second photodetectors 104a-b) to acquire emission measurements of the filament 120. In response to the formation of the filament 120 in the switching layer 114 of the ReRAM device 101, NIR emission can occur on one or more locations of the ReRAM device 101. For example, NIR emission can occur on one or more of the electrodes stacked on a top and bottom of the switching medium.

The process 300 can continue from operation 310 to block 312. At block 310, the controller can determine the filament location based on the signals detected in the photodetectors. At operation 316 the processor determines the location of the filament 120 and optionally displays the result on a display device.

The systems and methods described herein can be implemented to determine the location (e.g., location as determined by the relative input of at least two photodetectors positioned in proximity to the ReRAM device) of a conductive filament formed in a switching medium of a ReRAM device. The systems and methods described herein can be implemented with a practical application to locate the position of the filament during the formation process in a built in integrated approach, allowing measurements of a relatively large number of ReRAM devices and to create statistics of the filament formation using relatively large amount of data. Further, the systems and methods described herein utilize a shielding layer to prevent a third party from using optical inspection tools to visually identify the locations of the filaments.

Figure 5:
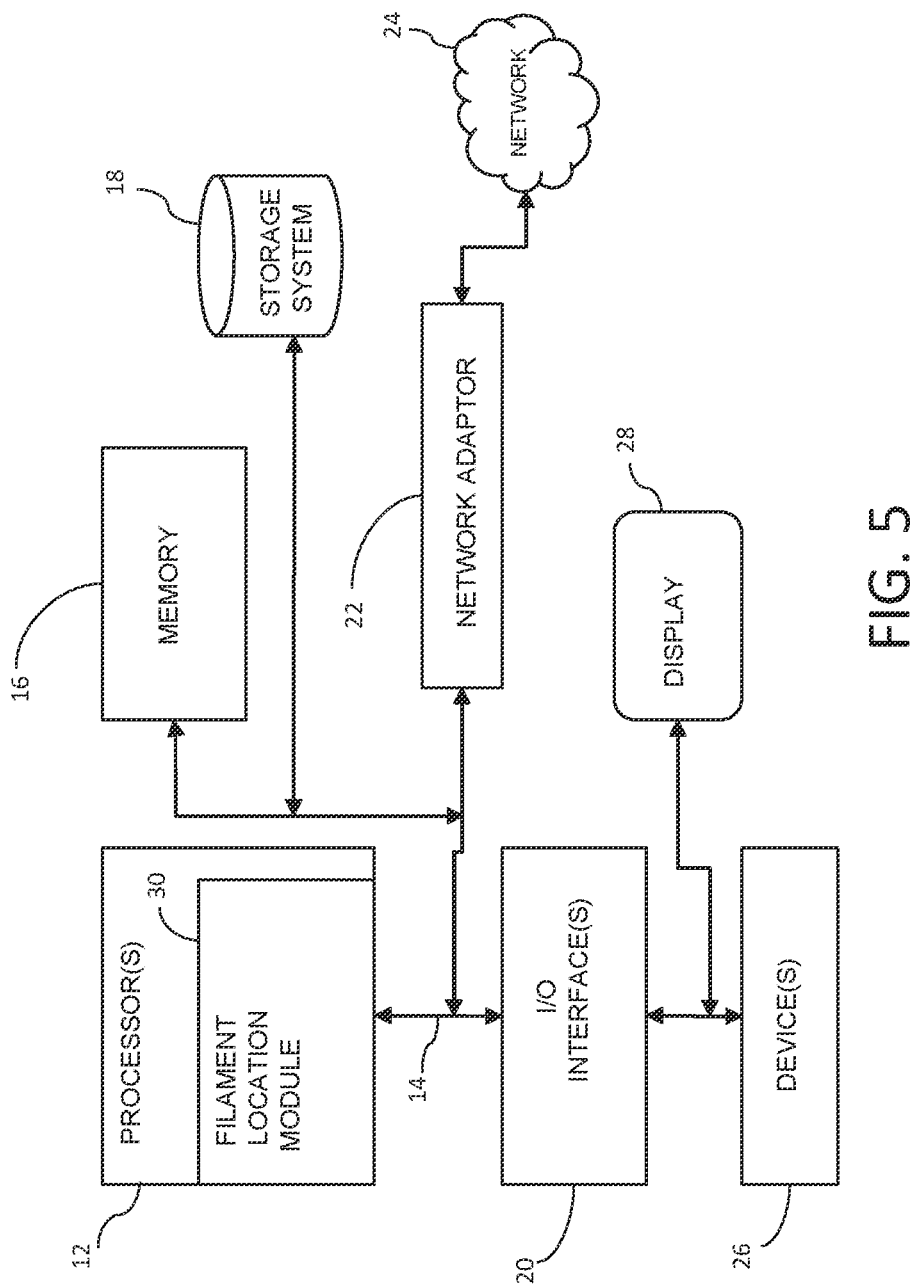
FIG. 5 illustrates a schematic of an example computer or processing system that may implement ReRAM filament location based on emission, according to embodiments.

FIG. 5 illustrates a schematic of an example computer or processing system that may implement ReRAM filament location based on NIR emission in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 5 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., filament location module 30) that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present embodiments may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a resistive memory device; and
   at least a first photodetector and a second photodetector positioned adjacent to the resistive memory device to allow for a spatial measurement of a filament in the resistive memory device.

2. The semiconductor device according to claim 1, wherein the first photodetector and the second photodetector are formed in or bonded to a substrate of the resistive memory device.

3. The semiconductor device according to claim 1, wherein the first photodetector and the second photodetector are arranged in an array.

4. The semiconductor device according to claim 1, further comprising a third photodetector positioned adjacent to the resistive memory device.

5. The semiconductor device according to claim 4, wherein the first photodetector, the second photodetector, and the third photodetector are arranged in an array.

6. The semiconductor device according to claim 1, further comprising an FEOL or BEOL layer formed between the resistive memory device and the first photodetector and the second photodetector.

7. The semiconductor device according to claim 1, wherein the first photodetector and the second photodetector are bonded to a first side of the resistive memory device.

8. The semiconductor device according to claim 7, further comprising a shield layer formed on a second side of the resistive memory device.

9. The semiconductor device according to claim 8, wherein the shield layer is opaque.

10. The semiconductor device according to claim 1, wherein the resistive memory device, the first photodetector and the second photodetector constitute a physically unclonable function.

11. A method comprising:
    acquiring signals from at least a first photodetector and a second photodetector indicating photon emission from a filament of a resistive memory device; and
    determining a location of the filament in a switching medium of the resistive memory device by comparing the acquired signals.

12. The method according to claim 11, wherein the first photodetector and the second photodetector are formed in or bonded to a substrate of the resistive memory device.

13. The method according to claim 11, wherein the first photodetector and the second photodetector are arranged in an array.

14. The method according to claim 11, further comprising acquiring a signal from a third photodetector indicating the intensity of photon emission from the filament of the resistive memory device.

15. The method according to claim 14, wherein the first photodetector, the second photodetector, and the third photodetector are arranged in an array.

16. The method according to claim 15, wherein determining the location of the filament includes inputting the signals from the first photodetector, the second photodetector and the third photodetector into a triangulation model to determine the coordinates of the filament.

17. The method according to claim 11, further comprising bonding the first photodetector and the second photodetector to a first side of the resistive memory device, and forming a shield layer on a second side of the resistive memory device.

18. The method according to claim 17, wherein the shield layer is opaque.

19. The method according to claim 11, wherein determining the location of the filament includes inputting the signals from the first photodetector and the second photodetector and the third photodetector into an interpolation model to determine the coordinates of the filament.

20. The method according to claim 11, wherein the resistive memory device, the first photodetector and the second photodetector constitute a physically unclonable function.

* * * * *